United States Patent
Nam et al.

(10) Patent No.: US 9,659,662 B2
(45) Date of Patent: May 23, 2017

(54) NONVOLATILE MEMORY DEVICE AND METHOD OF ERASING NONVOLATILE MEMORY DEVICE

(71) Applicants: Sang-Wan Nam, Hwaseong-si (KR);
Kang-Bin Lee, Suwon-si (KR);
Kihwan Choi, Seongnam-si (KR)

(72) Inventors: Sang-Wan Nam, Hwaseong-si (KR);
Kang-Bin Lee, Suwon-si (KR);
Kihwan Choi, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/501,352

(22) Filed: Sep. 30, 2014

(65) Prior Publication Data
US 2015/0179271 A1    Jun. 25, 2015

(30) Foreign Application Priority Data

Dec. 19, 2013   (KR) .......................... 10-2013-0159554

(51) Int. Cl.
*G11C 16/16*     (2006.01)
*G11C 16/04*     (2006.01)

(52) U.S. Cl.
CPC .......... *G11C 16/16* (2013.01); *G11C 16/0483* (2013.01)

(58) Field of Classification Search
CPC ..... G11C 16/16; G11C 16/14; G11C 16/3445; G11C 16/3436; G11C 11/5635; G11C 13/0097
See application file for complete search history.

(56) References Cited

U.S. PATENT DOCUMENTS

| | | | |
|---|---|---|---|
| 5,657,268 A | 8/1997 | Truong et al. | |
| 5,822,252 A * | 10/1998 | Lee ........................ | H01L 27/115 257/E27.103 |
| 5,978,277 A * | 11/1999 | Hsu .................... | G11C 16/3409 365/185.11 |
| 6,515,910 B1 * | 2/2003 | Lee .................... | G11C 16/3404 365/185.09 |
| 6,804,148 B2 | 10/2004 | Bedarida et al. | |
| 7,095,656 B2 | 8/2006 | Lee | |
| 7,403,429 B2 * | 7/2008 | Chae ...................... | G11C 16/16 365/185.24 |
| 7,529,138 B2 * | 5/2009 | Park ........................ | G11C 16/16 365/185.17 |

(Continued)

FOREIGN PATENT DOCUMENTS

| | | |
|---|---|---|
| JP | 2008-146695 A | 6/2008 |
| KR | 10-2009-0124103 A | 12/2009 |
| KR | 10-2011-0100579 A | 9/2011 |

*Primary Examiner* — Huan Hoang
*Assistant Examiner* — Roberto Mancera
(74) *Attorney, Agent, or Firm* — Volentine & Whitt, PLLC

(57) ABSTRACT

A method is provided for erasing a nonvolatile memory device, including multiple memory blocks formed in a direction perpendicular to a substrate, each memory block having multiple strings connected to a bit line. The method includes selecting a memory block to be erased using a power supply voltage; unselecting a remaining memory block, other than the selected memory block, using a negative voltage; setting a bias condition to reduce leakage currents of the unselected memory block; and performing an erase operation on the selected memory block.

20 Claims, 15 Drawing Sheets

(56) References Cited

U.S. PATENT DOCUMENTS

| | | | |
|---|---|---|---|
| 7,548,463 B2 | 6/2009 | Watanabe et al. | |
| 7,551,492 B2* | 6/2009 | Kim | G11C 8/08 365/185.17 |
| 8,199,581 B2 | 6/2012 | Kim | |
| 8,203,876 B2 | 6/2012 | Goda et al. | |
| 8,213,240 B2 | 7/2012 | Kim | |
| 8,218,369 B2 | 7/2012 | Lin et al. | |
| 8,363,483 B2 | 1/2013 | Chu | |
| 8,488,382 B1* | 7/2013 | Li | G11C 16/0483 365/185.17 |
| 8,488,384 B2 | 7/2013 | Kim | |
| 8,553,466 B2* | 10/2013 | Han | G11C 16/04 365/185.18 |
| 8,570,805 B2* | 10/2013 | Lee | G11C 16/0483 365/185.17 |
| 8,705,273 B2* | 4/2014 | Kim | G11C 5/14 365/185.03 |
| 8,730,738 B2* | 5/2014 | Oh | G11C 16/10 365/185.17 |
| 8,787,094 B2* | 7/2014 | Costa | G11C 5/02 365/185.17 |
| 8,792,282 B2* | 7/2014 | Lee | G11C 16/0483 365/185.14 |
| 8,885,412 B2* | 11/2014 | Li | G11C 16/0483 365/185.12 |
| 8,897,070 B2* | 11/2014 | Dong | G11C 16/0483 365/185.17 |
| 8,908,431 B2* | 12/2014 | Shim | G11C 16/10 365/185.02 |
| 8,917,558 B2* | 12/2014 | Han | G11C 16/16 365/185.05 |
| 8,923,060 B2* | 12/2014 | Shim | G11C 16/30 365/185.17 |
| 8,964,476 B2* | 2/2015 | Shim | G11C 16/0483 365/185.17 |
| 8,964,481 B2* | 2/2015 | Oh | H01L 27/11524 365/185.11 |
| 8,990,483 B2* | 3/2015 | Kwak | G11C 16/3495 365/185.11 |
| 9,019,775 B2* | 4/2015 | Costa | G11O 5/02 365/185.17 |
| 9,025,382 B2* | 5/2015 | Rhie | G11C 16/26 365/185.13 |
| 2002/0036930 A1* | 3/2002 | Shibata | G11C 11/5628 365/195 |
| 2006/0108627 A1* | 5/2006 | Choi | H01L 21/8221 257/314 |
| 2007/0133305 A1* | 6/2007 | Chae | G11C 16/08 365/185.26 |
| 2007/0230253 A1* | 10/2007 | Kim | G11C 8/08 365/185.29 |
| 2007/0263452 A1* | 11/2007 | Lee | G11C 16/344 365/185.22 |
| 2008/0112227 A1* | 5/2008 | Kim | G11C 16/0483 365/185.17 |
| 2008/0198657 A1* | 8/2008 | Kim | G11C 5/14 365/185.18 |
| 2009/0086542 A1* | 4/2009 | Lee | G11C 11/5628 365/185.17 |
| 2009/0175081 A1* | 7/2009 | Kim | G11C 16/16 365/185.11 |
| 2009/0316487 A1* | 12/2009 | Lee | G11C 11/5628 365/185.22 |
| 2010/0002515 A1* | 1/2010 | Lutze | G11C 11/5635 365/185.17 |
| 2011/0096602 A1* | 4/2011 | Kim | G11C 16/34 365/185.11 |
| 2011/0199825 A1* | 8/2011 | Han | G11C 16/10 365/185.11 |
| 2011/0216603 A1* | 9/2011 | Han | G11C 16/04 365/185.23 |
| 2012/0008415 A1* | 1/2012 | Park | G11C 16/14 365/185.25 |
| 2012/0051143 A1* | 3/2012 | Yoon | G11C 16/0483 365/185.22 |
| 2012/0063223 A1* | 3/2012 | Lee | G11C 16/0433 365/185.02 |
| 2012/0170376 A1 | 7/2012 | Lee et al. | |
| 2012/0275234 A1 | 11/2012 | Lee et al. | |
| 2013/0007353 A1* | 1/2013 | Shim | G11C 16/10 711/103 |
| 2013/0083599 A1* | 4/2013 | Nam | G11C 16/14 365/185.11 |
| 2013/0100737 A1* | 4/2013 | Kwak | H01L 27/1157 365/185.11 |
| 2014/0112074 A1* | 4/2014 | Rhie | G11C 16/14 365/185.11 |
| 2014/0192594 A1* | 7/2014 | Lue | G11C 16/10 365/185.11 |
| 2014/0264541 A1* | 9/2014 | Rhie | H01L 29/792 257/324 |

* cited by examiner

NONVOLATILE MEMORY DEVICE AND METHOD OF ERASING NONVOLATILE MEMORY DEVICE

CROSS-REFERENCE TO RELATED APPLICATIONS

A claim for priority under 35 U.S.C. §119 is made to Korean Patent Application No. 10-2013-0159554 filed Dec. 19, 2013, in the Korean Intellectual Property Office, the entire contents of which are hereby incorporated by reference.

BACKGROUND

Embodiments of the inventive concept described herein relate to a nonvolatile memory device and a method of erasing a nonvolatile memory device.

Semiconductor memory devices may be divided into volatile semiconductor memory devices or nonvolatile semiconductor memory devices. The nonvolatile semiconductor memory devices retain stored data even when powered off. Data stored in a nonvolatile semiconductor memory device may be permanent or reprogrammable, depending upon the fabrication technology used. Nonvolatile semiconductor memory devices may be used for user data, program, and microcode storage in a wide variety of applications in the computer, avionics, telecommunications, and consumer electronics industries, for example.

SUMMARY

One aspect of embodiments of the inventive concept provides a method for erasing a nonvolatile memory device, including multiple memory blocks formed in a direction perpendicular to a substrate, each memory block having multiple strings connected to a bit line. The method includes selecting a memory block to be erased using a power supply voltage; unselecting a remaining memory block, other than the selected memory block, using a negative voltage; setting a bias condition to reduce leakage currents of the unselected memory block; and performing an erase operation on the selected memory block.

The erase operation may include a setup period, an erase execution period, and a recovery period. The may further include applying the negative voltage to a well of an address decoder for selecting the memory block and unselecting the remaining memory block during the erase operation.

The method may further include applying a ground voltage to the well of the address decoder during the recovery period.

The method may further include applying a word line erase voltage to source lines connected to the unselected memory block during the setup and erase execution periods; and applying the power supply voltage to the source lines connected to the unselected memory block during the recovery period.

The method may further include applying the power supply voltage to source lines connected to the unselected memory block during the setup period; applying a word line erase voltage to the source lines connected to the unselected memory block during the erase execution period; and applying the power supply voltage to the source lines connected to the unselected memory block during the recovery period.

The method may further include applying a word line erase voltage to a ground selection line connected to the unselected memory block during a predetermined delay time period of the setup period; and applying the power supply voltage to the ground selection line connected to the unselected memory block after the predetermined time of the setup period elapses.

The method may further include floating word lines, a string selection line and a ground selection line connected to the unselected memory block when a voltage of the substrate becomes an erase voltage.

The method may further include applying a word line erase voltage to word lines connected to the selected memory block; and floating a string selection line connected to the selected memory block. The word line erase voltage may be higher than a ground voltage and lower than the power supply voltage.

Another aspect of embodiments of the inventive concept provides a nonvolatile memory device including multiple memory blocks, an address decoder and control logic. The memory blocks are formed in a direction perpendicular to a substrate, each memory block including multiple strings connected to a bit line, and each string having at least one string selection transistor, multiple memory cells and at least one ground selection transistor. The address decoder is configured to select a memory block of the memory blocks to be erased in response to an address during an erase operation, remaining memory blocks other than the selected memory block being unselected. The control logic is configured to control the address decoder such that, during the erase operation, the selected memory block is selected using a power supply voltage and a negative voltage and the remaining memory blocks are unselected using the negative voltage.

The address decoder may include a first pass transistor connecting a first word line connected to a memory cell of the selected memory block to a first source line and having a gate connected to receive the power supply voltage and a body connected to receive the negative voltage; and second pass transistors corresponding to the unselected memory blocks, each second pass transistor connecting a second word line connected to a memory cell of each of the unselected memory blocks to a second source line and having a gate connected to receive the negative voltage and a body connected to receive the negative voltage.

The address decoder may include a first ground pass transistor connecting a first ground selection line connected to a ground selection transistor of the selected memory block to a first ground source line and having a gate connected to receive the power supply voltage and a body connected to receive the negative voltage; and second ground pass transistors corresponding to the unselected memory blocks, each second ground pass transistor connecting a second ground selection line connected to a ground selection transistor of each of the unselected memory blocks to a second ground source line and having a gate and a body connected to receive the negative voltage. During the erase operation, an erase word line voltage may be first applied to the first and second ground source lines during a predetermined delay time period, and the power supply voltage may then be applied to the first and second ground source lines.

During the erase operation, the negative voltage may be applied to a well of the address decoder and to a gate and a body of at least one pass transistor included in the address decoder.

The erase operation may include a setup period, an erase execution period and a recovery period. The power supply voltage may be applied to source lines connected to the unselected memory blocks during the setup and recovery periods.

A ground selection line (GSL) delay scheme may be used during the erase operation.

Another aspect of embodiments of the inventive concept provides a nonvolatile memory device including a memory cell array having multiple memory blocks, each memory block including multiple strings connected to a bit line, and each string having at least one string selection transistor, multiple memory cells and at least one ground selection transistor. The nonvolatile memory device further includes an address decoder for selecting a memory block of the memory blocks to be erased during an erase operation, and for unselecting a memory block of the memory blocks other than the selected memory block to be erase-inhibited during the erase operation; and control logic configured to control the address decoder to provide a power supply voltage and a negative voltage to the selected memory block and to provide the negative voltage to the unselected memory block to reduce leakage current from the unselected memory block during the erase operation.

The address decoder may include a first pass transistor having a gate for receiving a power supply voltage and a body for receiving the negative voltage in order to connect a first source line and a first word line connected to a first memory cell of the selected memory block during the erase operation; and a second pass transistor having a gate for receiving the negative voltage and a body for receiving the negative voltage in order to connect a second source line and a second word line connected to a second memory cell of the unselected memory block during the erase operation.

An erase voltage my be applied to a source of each of the first and second memory cells, and a word line erase voltage may be applied to a gate of the first memory cell, during the erase operation. A word line erase voltage of the second source line may be set to be higher than 0V, which together with the negative voltage applied to the gate of the second pass transistor, decreases a gate-source voltage of the second pass transistor.

According to embodiments of the inventive concept, as leakage current of an unselected memory block is reduced using a negative voltage, reliability of data is improved.

BRIEF DESCRIPTION OF THE FIGURES

Exemplary embodiments of the inventive concept will be more clearly understood from the following description taken in conjunction with the accompanying figures, in which like reference numerals refer to like parts throughout the various figures unless otherwise specified, and in which.

DETAILED DESCRIPTION

Figure 1:
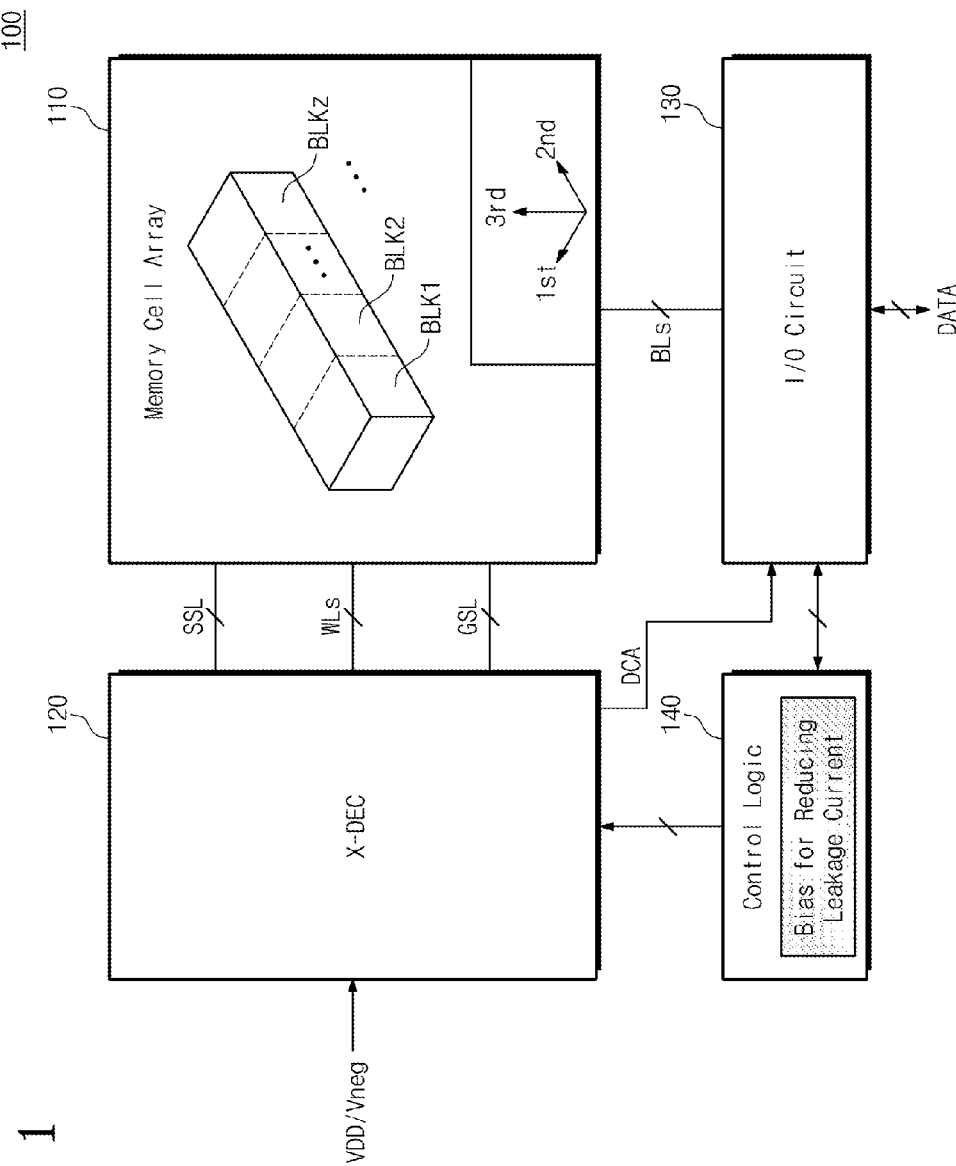
FIG. 1 is a block diagram schematically illustrating a nonvolatile memory device, according to an embodiment of the inventive concept.

Embodiments will be described in detail with reference to the following description and accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to one of ordinary skill in the art. Accordingly, known processes, elements, and techniques are not described with respect to some of the embodiments. Unless otherwise noted, like reference numerals denote like elements throughout the attached drawings and written description, and thus descriptions may not be repeated. In the drawings, sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

A nonvolatile memory device according to embodiments of the inventive concept improves reliability of data, by unselecting memory block(s) using a negative voltage and by setting a bias such that leakage current generated from the unselected memory block(s) is reduced, during an erase operation of a selected memory block. The nonvolatile memory device may be a NAND flash memory, a vertical NAND flash memory (VNAND), a NOR flash memory, a resistive random access memory (RRAM), a phase-change random access memory (PRAM), a magnetoresistive random access memory (MRAM), a spin transfer torque random access memory (STT-RAM), and the like. Also, the nonvolatile memory device is configured to have a three-dimensional array structure. Embodiments of the inventive concept are applicable to not only flash memory devices where a charge storage layer is formed of a floating gate, but also a charge trap flash (CTF) memory where a charge storage layer is formed of an insulation film. Below, it is assumed that a nonvolatile memory device is a vertical NAND flash memory device.

FIG. 1 is a block diagram schematically illustrating a nonvolatile memory device, according to an embodiment of the inventive concept. Referring to FIG. 1, a nonvolatile memory device 100 includes a memory cell array 110, an address decoder 120, an input/output circuit 130, and control logic 140.

The memory cell array 110 is connected to the address decoder 120 through word lines, at least one string selection line SSL, and at least one ground selection line GSL. The memory cell array 110 is connected to the input/output circuit 130 through bit lines. The memory cell array 110 includes a plurality of memory blocks BLK1 to BLKz (z being an integer of 2 or more).

Each of the memory blocks BLK1 to BLKz includes a plurality of strings that are arranged along a first direction and a second direction (different from the first direction) and along a third direction (perpendicular to a plane formed in the first and second directions) to have a three-dimensional structure. Here, each string may include at least one string selection transistor, a plurality of memory cells, and at least one ground selection transistor stacked on a substrate. In exemplary embodiments, at least one dummy cell may be included between the at least one string selection transistor and the memory cells. Also, at least one dummy cell may be included between the memory cells and the at least one ground selection transistor. Each memory cell may store at least one data bit.

The address decoder 120 selects one of the memory blocks BLK1 to BLKz based on an input address. The address decoder 120 is connected to a selected memory block through the word lines, the at least one string selection line SSL and the at least one ground selection line GSL. Here, a power supply voltage VDD and a negative voltage Vneg may be used to select a memory block.

The address decoder 120 selects the word lines, the string selection line SSL and the ground selection line GSL using a decoded row address. Also, the address decoder 120 decodes a column address of the input address ADDR. The decoded column address DCA is provided to the input/output circuit 130. In exemplary embodiments, the address decoder 120 may include a row decoder, a column decoder and an address buffer, for example.

The input/output circuit 130 is connected to the memory cell array 110 through the bit lines. The input/output circuit 130 is configured to receive the decoded column address DCA from the address decoder 120, and to select the bit lines using the decoded column address DCA.

The input/output circuit 130 receives data from an external device, e.g., a memory controller (not shown) and stores the received data in the memory cell array 110. The input/output circuit 130 also reads data from the memory cell array 110 to output to the external device. Meanwhile, the input/output circuit 130 may read data from a first area of the memory cell array 110 to store it in a second area of the memory cell array 110. For example, the input/output circuit 130 may be configured to perform a copy-back operation.

The control logic 140 controls overall operations of the nonvolatile memory device 100 including program operations, read operations and erase operations, for example. The control logic 140 operates in response to control signals and/or commands provided from the external device.

Also, the control logic 140 controls internal components (e.g., the memory cell array 110, the address decoder 120, and the input/output circuit 130) according to biases that are set to reduce leakage current. For example, the control logic 140 may provide a negative voltage Vneg to a well of the address decoder 120 to reduce leakage current generated from unselected memory block(s) during an erase operation of the selected memory block. Other bias conditions of the address decoder 120 may be set variously to reduce leakage current generated from the unselected memory block(s) during the erase operation of the selected memory block.

The nonvolatile memory device 100 according to an embodiment of the inventive concept reduces block erase disturbance (BED) by setting a bias condition such that leakage current generated from at least one unselected memory block is reduced during an erase operation of the selected memory block. Thus, reliability of data stored in the at least one unselected memory block is improved.

Figure 2:
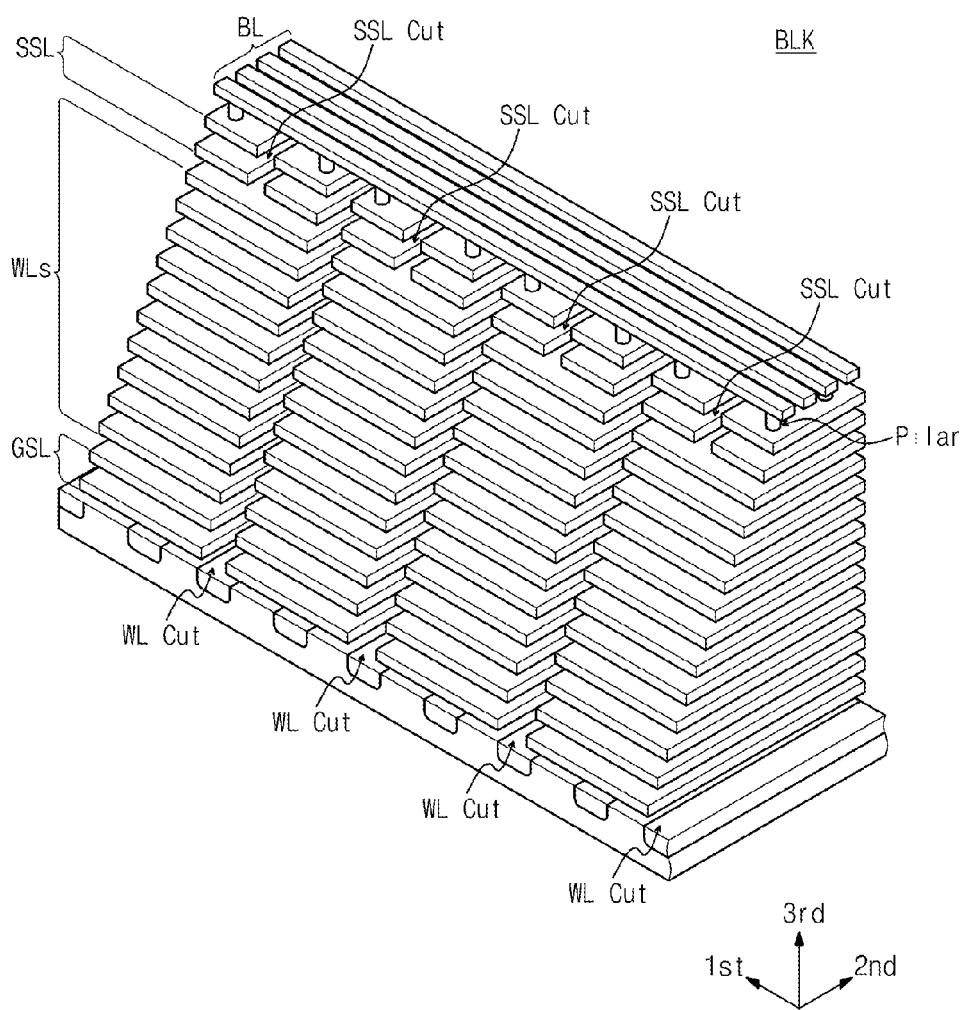
FIG. 2 is a perspective view of a memory block shown in FIG. 1, according to an embodiment of the inventive concept.

FIG. 2 is a perspective view of a memory block shown in FIG. 1, according to an embodiment of the inventive concept. Referring to FIG. 2, four sub blocks of memory block BLK are formed on a substrate. Each sub block is formed by stacking between word line cuts at least one ground selection line GSL, multiple word lines and at least one string selection line SSL on the substrate in a plate shape. At least one plate-shaped dummy line is stacked between the ground selection line GSL and the word lines. Or, at least one plate-shaped dummy line is stacked between the word lines and the string selection line SSL.

The string selection line SSL is separated by string selection line cuts. Although not shown in FIG. 2, each word line cut may include a common source line CSL. In exemplary embodiments, the common source lines CSL included in the word line cuts may be interconnected. A string may be formed by making a pillar connected to a bit line penetrate the at least one string selection line SSL, the word lines and the at least one ground selection line GSL.

FIG. 2 illustrates an embodiment in which a structure between word line cuts is a sub block. However, the inventive concept is not limited thereto. For example, a structure between a word line cut and a string selection line cut may be defined as a sub block.

The memory block BLK according to an embodiment of the inventive concept may be configured to have a merged word line structure where two word lines are merged to one.

Figure 3:
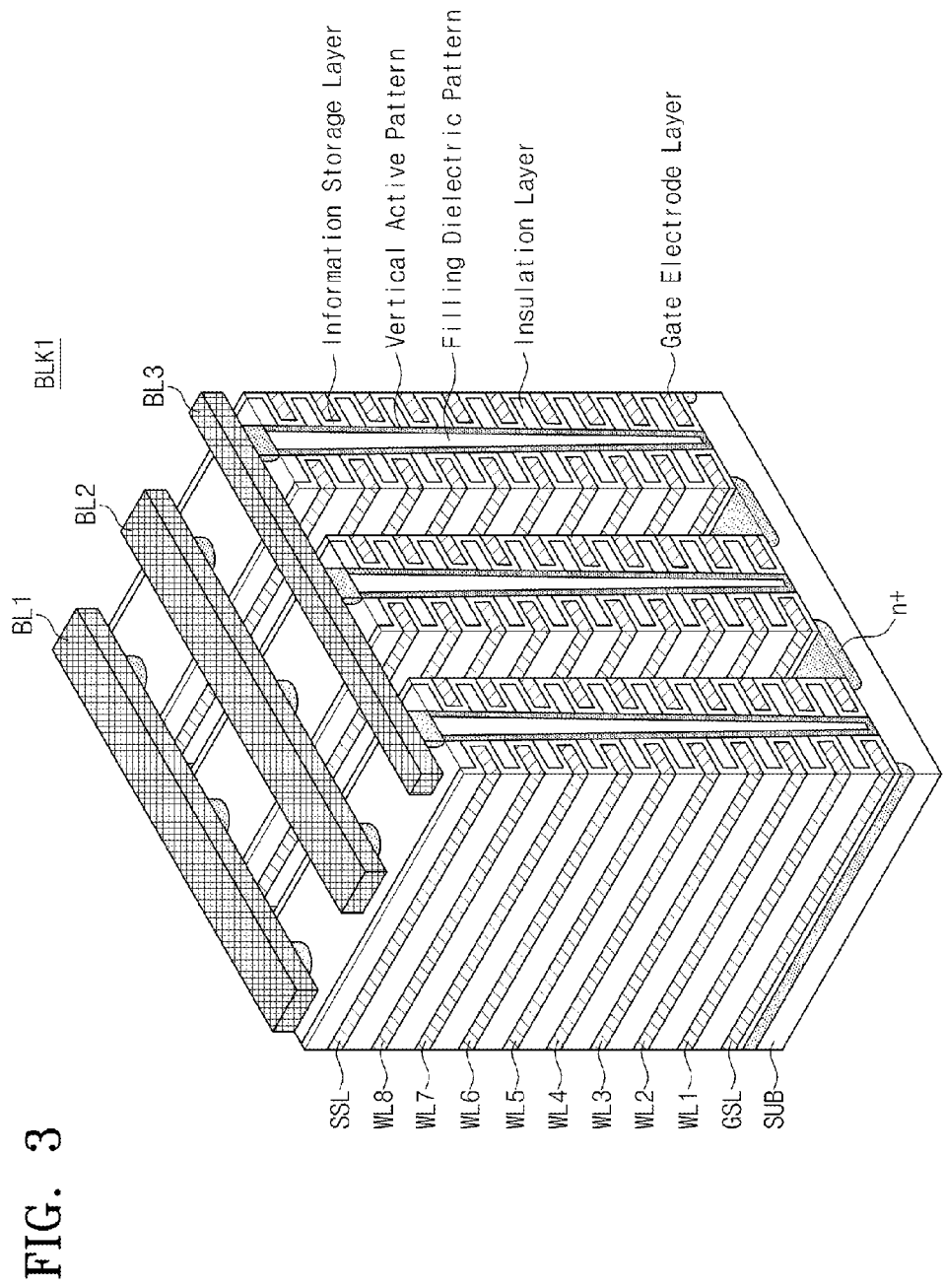
FIG. 3 is a perspective view schematically illustrating a memory block, according to an embodiment of the inventive concept.

FIG. 3 is a perspective view schematically illustrating a memory block, according to an embodiment of the inventive concept. Referring to FIG. 3, a memory block is formed in a direction perpendicular to a substrate SUB. An n+ doping region is formed in the substrate SUB.

A gate electrode layer and an insulation layer are deposited on the substrate SUB in turn. A charge storage layer is formed between the gate electrode layer and the insulation layer.

If the gate electrode layer and the insulation layer are patterned in a vertical direction, a V-shaped pillar is formed. The pillar is connected to the substrate SUB through the gate electrode layer and the insulation layer. An outer portion of the pillar may be formed of channel semiconductor as a vertical active pattern, and an inner portion thereof may be formed of an insulation material, such as silicon oxide, as a filling dielectric pattern.

The gate electrode layer of the memory block BLK1 is connected to a ground selection line GSL, multiple word lines WL1 to WL8, and a string selection line SSL. The pillars of the memory block BLK1 are connected to multiple bit lines BL1 to BL3. FIG. 3 illustrates an example in which one memory block BLK1 has two selection lines SSL and GSL, eight word lines WL1 to WL8, and three bit lines BL1 to BL3. However, the numbers of the various lines may vary without departing from the scope of the present teachings.

Figure 4:
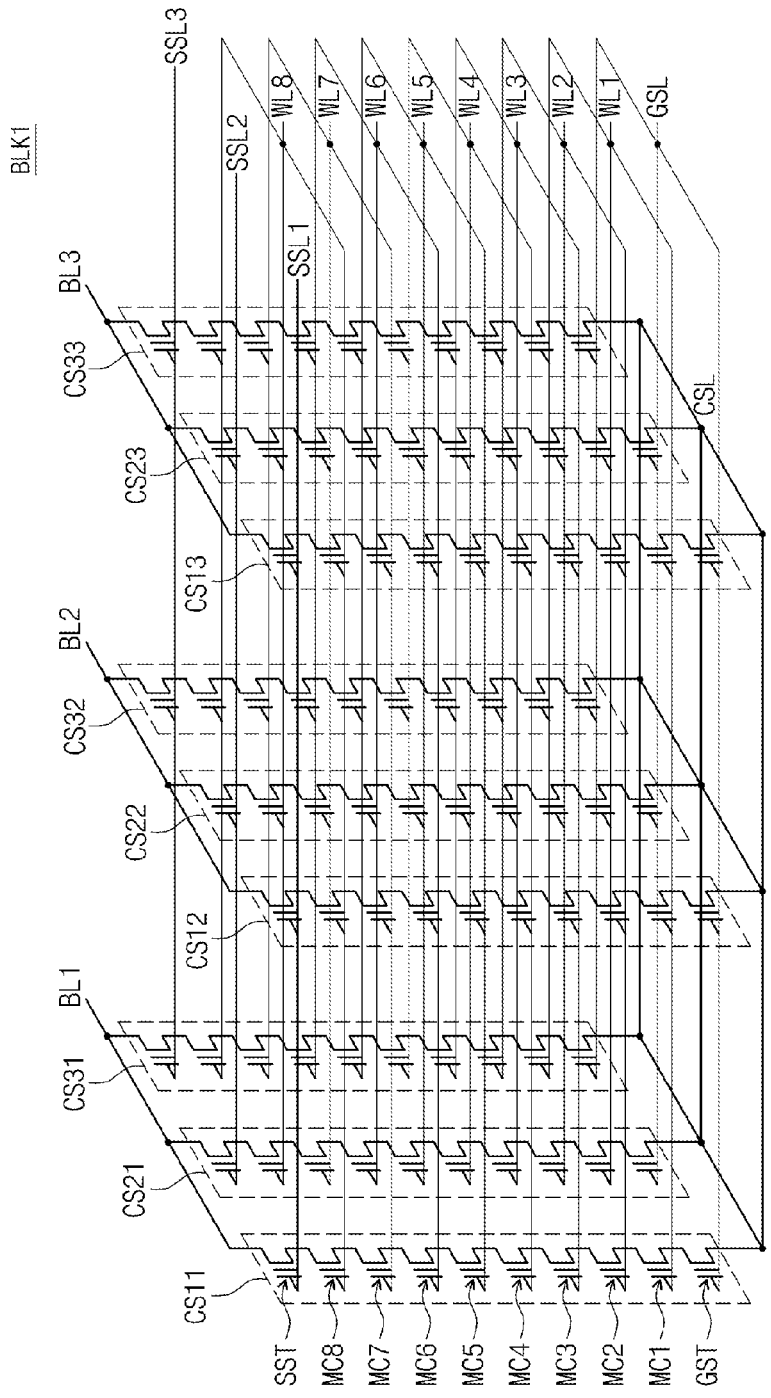
FIG. 4 is a circuit diagram schematically illustrating an equivalent circuit of a memory block shown in FIG. 3, according to an embodiment of the inventive concept.

FIG. 4 is a circuit diagram schematically illustrating an equivalent circuit of a memory block BLK1 shown in FIG. 3, according to an embodiment of the inventive concept. Referring to FIG. 4, cell strings CS11 to CS33 may be connected between bit lines BL1 to BL3 and a common source line CSL, respectively. Each cell string (e.g., CS11) includes a string selection transistor SST, multiple memory cells MC1 to MC8, and a ground selection transistor GST.

The string selection transistors SST are connected to a string selection line SSL. The string selection line SSL is divided into first to third string selection lines SSL1 to SSL3. The ground selection transistors GST are connected to a ground selection line GSL. In each cell string, the string selection transistor SST is connected to a bit line, and the ground selection transistor GST is connected to the common source line CSL. Meanwhile, a ground selection line GSL may be divided into respective ground selection lines like SSL1~SSL3.

In each cell string CS11 to CS33, the memory cells MC1 to MC8 are connected to corresponding word lines WL1 to WL8, respectively. A group of memory cells that are connected to a word line and are programmed at the same time may be referred to as a page. The memory block BLK1 may include multiple pages. One word line may be connected with multiple pages. Referring to FIG. 4, a word line (e.g., WL4) spaced apart from the common source line CSL by a predetermined distance may be connected in common to three pages, for example.

Each memory cell may store one bit of data or two or more bits of data. A memory cell storing 1-bit data may be referred to as a single-level cell (SLC) or a single-bit cell. A memory cell storing two or more bits of data may be referred to as a multi-level cell (MLC) or a multi-bit cell. In a 2-bit MLC, two pages of data may be stored in a physical page. Thus, six pages of data may be stored in memory cells connected to a word line WL4, for example.

A three-dimensional nonvolatile memory device may be implemented with a charge trap flash (CTF). In this case, an initial verify shift (IVS) phenomenon may be generated such that charges trapped in the programmed CTF are redistributed and leaked over time. Reprogramming may be performed to overcome such distribution deterioration.

Figure 5:
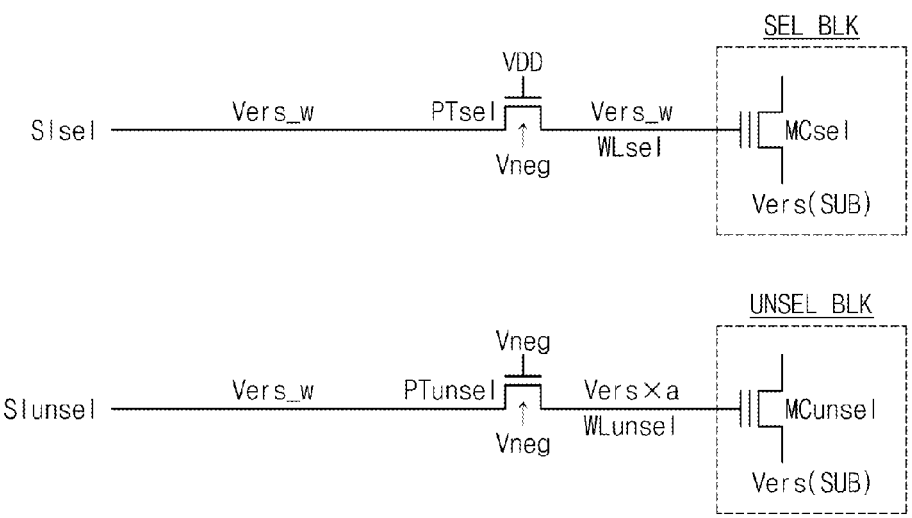
FIG. 5 is a diagram schematically illustrating a pass transistor bias condition for conceptually describing an erase operation, according to an embodiment of the inventive concept.

FIG. 5 is a diagram schematically illustrating a pass transistor bias condition for conceptually describing an erase operation, according to an embodiment of the inventive concept. For ease of description, an exemplary memory cell MCsel included in a selected memory block and an exemplary memory cell MCunsel included in an unselected memory block are illustrated in FIG. 5.

An erase operation, associated with the memory cell MCsel included in the selected memory block, is described below. As illustrated in FIG. 5, a memory block to be erased may be selected by providing a power supply voltage VDD to a gate of a corresponding pass transistor PTsel and a negative voltage Vneg to a body of the pass transistor PTsel.

In the selected memory block, the memory cell MCsel is erased by supplying a word line erase voltage Vers_w to a gate of the memory cell MCsel by word line WLsel, and by providing an erase voltage Vers to a source of the memory cell MCsel by a substrate SUB, which is supplied with the erase voltage Vers via a channel.

Here, the word line erase voltage Vers_w is provided to the word line WLsel from a source line Sl_sel when the pass transistor PTsel is turned on by the power supply voltage VDD. In exemplary embodiments, the word line erase voltage Vers_w is higher than 0 V and lower than the power supply voltage VDD. For example, the word line erase voltage Vers_w may be about 0.3 V.

In contrast, as illustrated in FIG. 5, a memory block to be erase-inhibited may be unselected by applying the negative voltage Vneg to a gate and a bulk of a corresponding pass transistor PTunsel. Since the unselected memory block and the selected memory block all are formed on the same substrate SUB, the erase voltage Vers applied to the substrate SUB is also transferred to a source of the memory cell MCunsel. Each of the pass transistors PTsel and PTunsel may be included in the address decoder 120, for example.

A word line WLunsel is floated such that the memory cell MCunsel is not erased. As the pass transistor PTunsel is turned off by the negative voltage Vneg, the word line WLunsel is floated. That is, the word line WLunsel is electrically blocked from a source line Sl_unsel to which the word line erase voltage Vers_w is applied. During an erase operation of the selected memory block, the voltage of the floated word line WLunsel may be boosted up to a voltage (Vers×a) corresponding to the erase voltage Vers by coupling; hence, the memory cell MCunsel is not erased. In exemplary embodiments, the negative voltage Vneg may be −1 V.

A problem with conventional nonvolatile memory devices is that an unselected memory cell is erased due to leakage of the voltage (Vers×a) of the unselected word line WLunsel. In comparison, a nonvolatile memory device according to embodiments of the inventive concept decreases a gate-source voltage Vgs of the pass transistor PTunsel such that the voltage (Vers×a) (a being a real number less than 1 and greater than 0) of the word line WLunsel in the unselected memory block is not leaked. To decrease the gate-source voltage Vgs of the pass transistor PTunsel, the word line erase voltage Vers_w of the source line Slunsel is set to be higher than 0V and the voltage applied to the gate of the pass transistor PTunsel is set to the negative voltage Vneg.

Also, during an erase operation, the nonvolatile memory device according to embodiments of the inventive concept provides the negative voltage Vneg to a body of the pass transistor PTunsel such that a voltage (Vers×a) of the word line WLunsel in the unselected memory block is not leaked. With this bias condition, a threshold voltage of the pass transistor PTunsel increases according to the body effect compared with a conventional case. A leakage current of the pass transistor PTunsel decreases in proportion to an increase in the threshold voltage of the pass transistor PTunsel.

The pass transistors PTsel and PTunsel connected to word lines WLsel and WLunsel are described with reference to FIG. 5. However, the inventive concept is not limited thereto. For example, pass transistors connected to a string selection line SSL and a ground selection line GSL may be biased in a manner similar to that described above.

Meanwhile, the inventive concept is applicable to the GSL delay scheme that enables an erase voltage Vers to be easily applied to a vertical channel during an erase operation. The GSL delay scheme is described in detail, for example, in U.S. Patent Application Publication No. 2012-0275234, the entire contents of which are hereby incorporated by reference.

Figure 6:
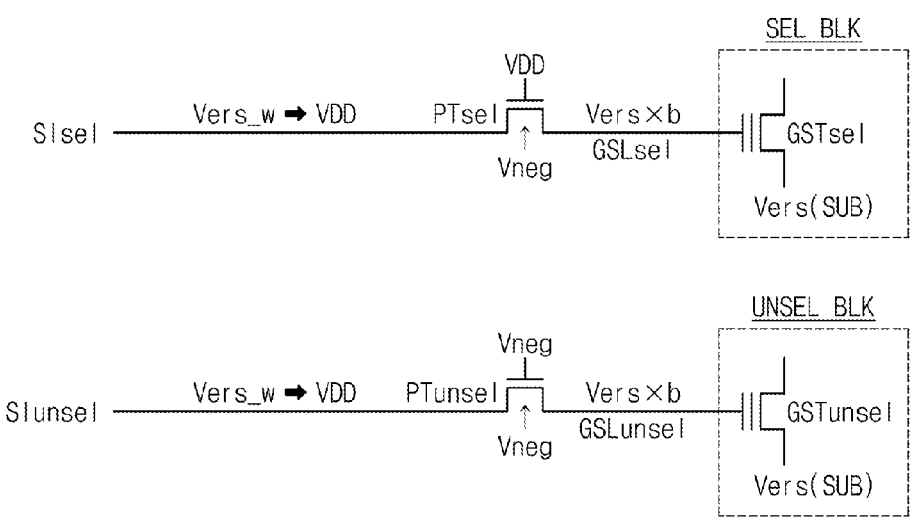
FIG. 6 is a diagram schematically illustrating a pass transistor bias condition at an erase operation using the GSL delay scheme according to an embodiment of the inventive concept.

FIG. 6 is a diagram schematically illustrating a pass transistor bias condition during an erase operation using the GSL delay scheme, according to an embodiment of the inventive concept. According to the GSL delay scheme, voltages applied to ground source lines Slsel and Slunsel associated with ground selection lines GSLsel and GSLunsel are different from those described above with reference to FIG. 5. A word line erase voltage Vers_w is first applied to source lines Slsel and Slunsel. After a delay time period elapses, a power supply voltage VDD is applied to the source lines Slsel and Slunsel; hence, the ground selection lines GSLsel and GSLunsel are floated. At this time, voltages of the ground selection lines GSLsel and GSLunsel are boosted up to a voltage (Vers×b) (b being a real number less than 1 and greater than 0) corresponding to the erase voltage Vers by coupling.

A nonvolatile memory device according to an embodiment of the inventive concept decreases a gate-source voltage Vgs of a pass transistor PTunsel by increasing a voltage of a source line Slunsel from the word line erase voltage Vers_w to the power supply voltage VDD. Thus, it is possible to prevent a voltage (Vers×b) of selection line GSLunsel in an unselected memory block from being leaked. As stated above, each of the pass transistors PTsel and PTunsel may be included in the address decoder 120, for example.

Figure 10:
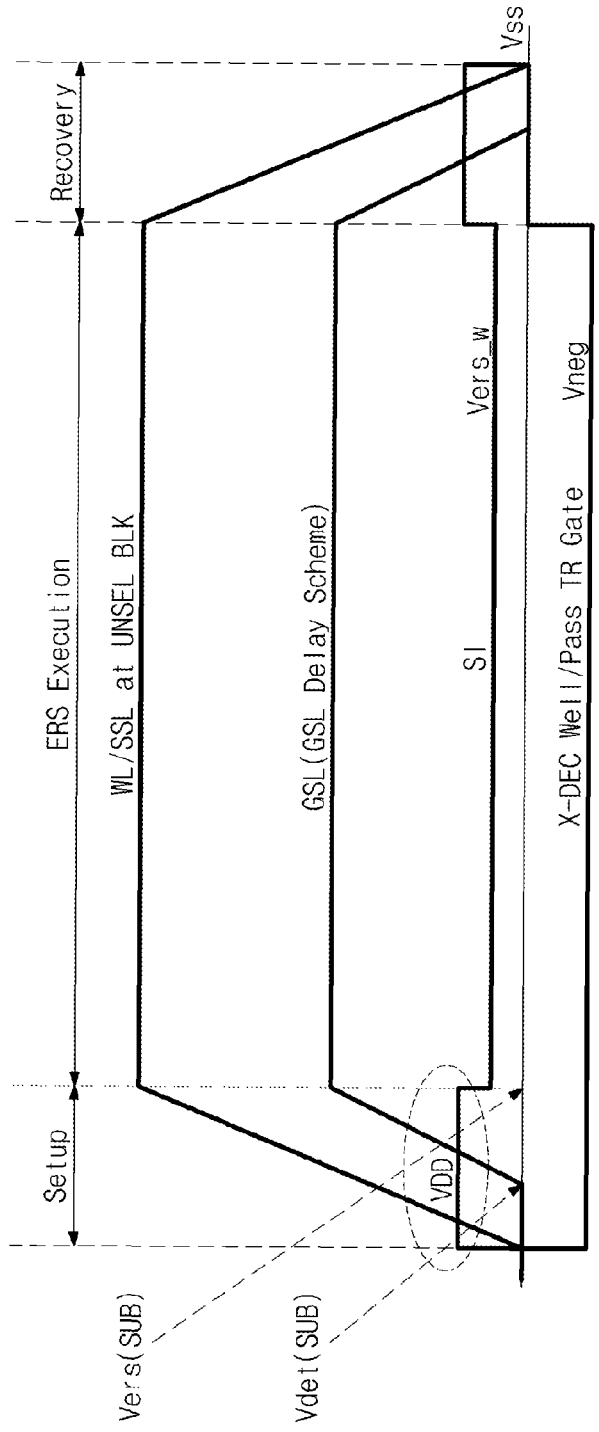
FIG. 10 is a diagram schematically illustrating a bias condition of an unselected memory block at an erase operation, according to a fourth embodiment of the inventive concept.
Figure 11:
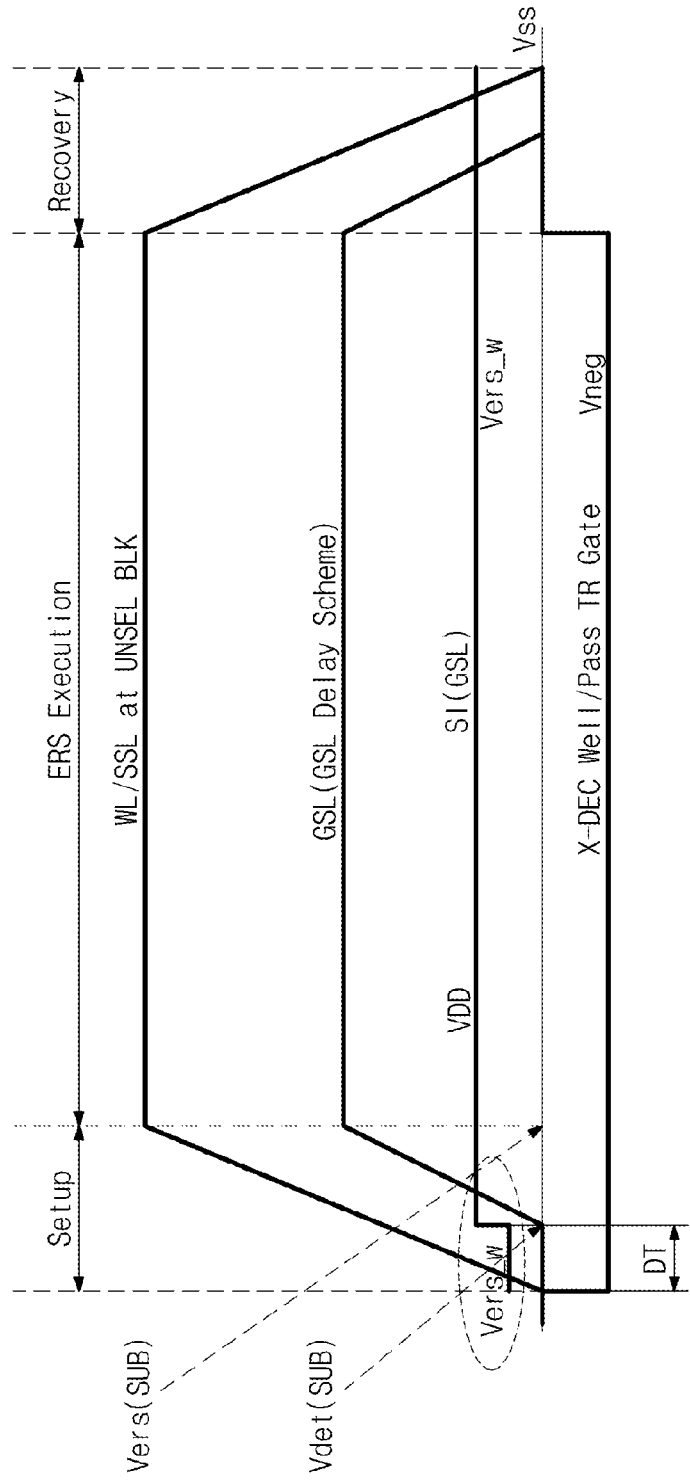
FIG. 11 is a diagram schematically illustrating a bias condition of an unselected memory block at an erase operation, according to a fifth embodiment of the inventive concept.
Figure 12:
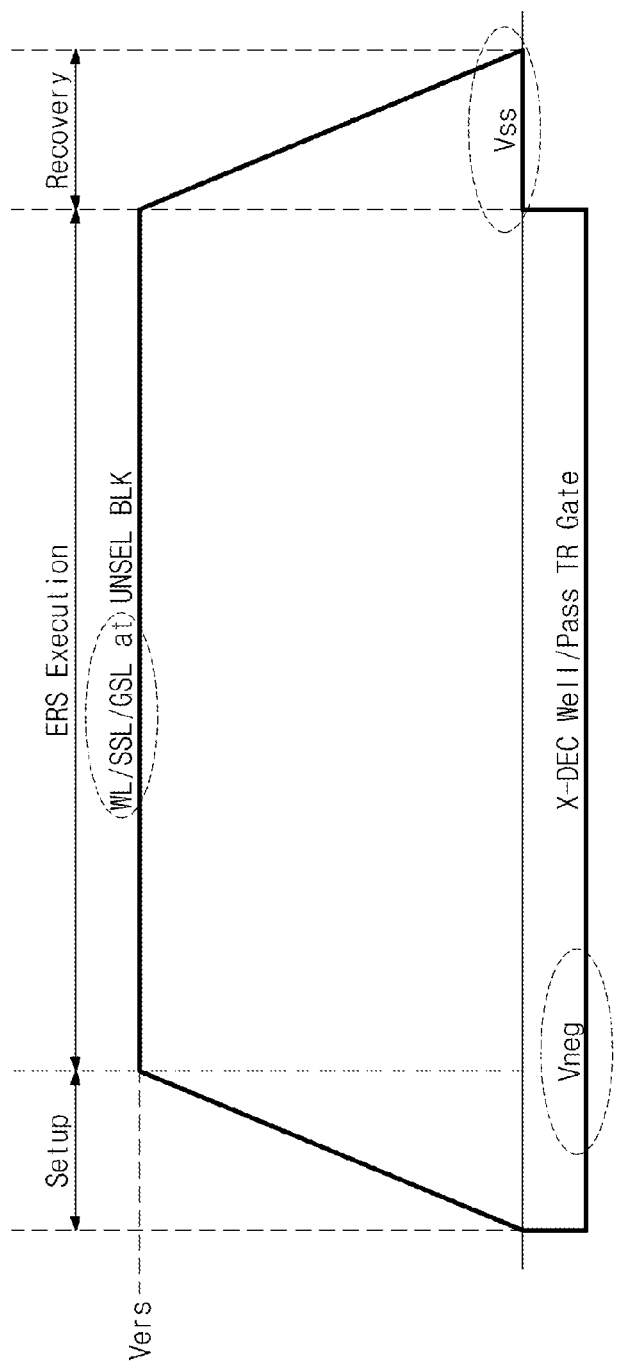
FIG. 12 is a diagram schematically illustrating a bias condition of an unselected memory block at an erase operation, according to a sixth embodiment of the inventive concept.

FIGS. 7 to 12 are diagrams schematically illustrating bias conditions of an unselected memory block during an erase operation, according to embodiments of the inventive concept. FIGS. 7 to 11, in particular, are directed to embodiments of a ground select line (GSL) delayed scheme, while FIG. 12 is not.

Figure 7:
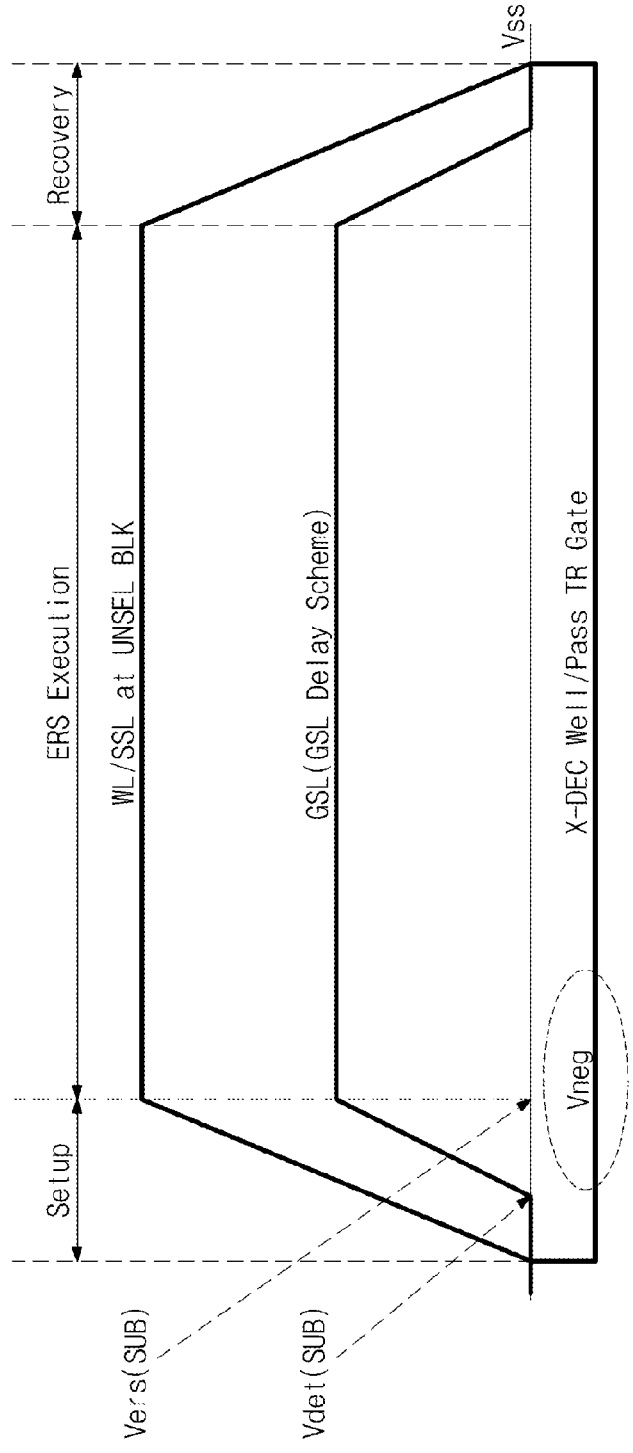
FIG. 7 is a diagram schematically illustrating a bias condition of an unselected memory block at an erase operation, according to a first embodiment of the inventive concept.

FIG. 7 is a diagram schematically illustrating a bias condition of an unselected memory block during an erase operation, according to a first embodiment of the inventive concept. Referring to FIG. 7, the erase operation includes a setup period, an erase execution period, and a recovery period.

During the setup period, an erase voltage Vers is applied to a substrate SUB of the memory blocks for the erase operation. At this time, word lines of a selected memory block are biased such that an erase operation is executed, and word lines of an unselected memory block are biased such that an erase operation is not performed (erase-inhibited). For ease of explanation, the following description refers to one unselected memory block, although it is understood that the description equally applies to multiple unselected memory blocks when there are more than one memory blocks other remaining after selection of the selected memory block.

In the selected memory block (not shown in FIGS. 7-12), an erase word line voltage Vers_w is applied to each word line, and a string selection line SSL is floated. The word line erase voltage Vers_w is also applied to a ground selection line GSL, and after a time period elapses, the ground selection line GSL is floated. Here, the time period is the amount of time taken for a voltage of the substrate SUB to reach a predetermined value Vdet.

In the unselected memory block, as illustrated in FIG. 7, a negative voltage Vneg is applied to a well of an address decoder (e.g., address decoder 120), and to the gate and body of the pass transistor corresponding to the unselected memory block. Also, the word line erase voltage Vers_w is applied to each word line and a string selection line SSL, where the word lines and the string selection line SSL are floated. As word lines and string selection line SSL of the unselected memory block are floated, their voltages are boosted to a predetermined voltage (e.g., Vers×a) according to the erase voltage Vers, applied to the substrate SUB, by coupling.

During the erase execution period, the selected memory block is erased according to the bias condition set in the setup period, and the unselected memory block is not erased according to the bias condition set in the setup period. At this time, the biases of the erase execution period maintain the final states of the setup period. During the recovery period, the biases used during the erase operation are discharged.

According to the erase operation of the inventive concept, leakage from the unselected memory block(s) is reduced by providing the negative voltage Vneg to the well of the address decoder, and to the gate and body of the pass transistor.

Figure 8:
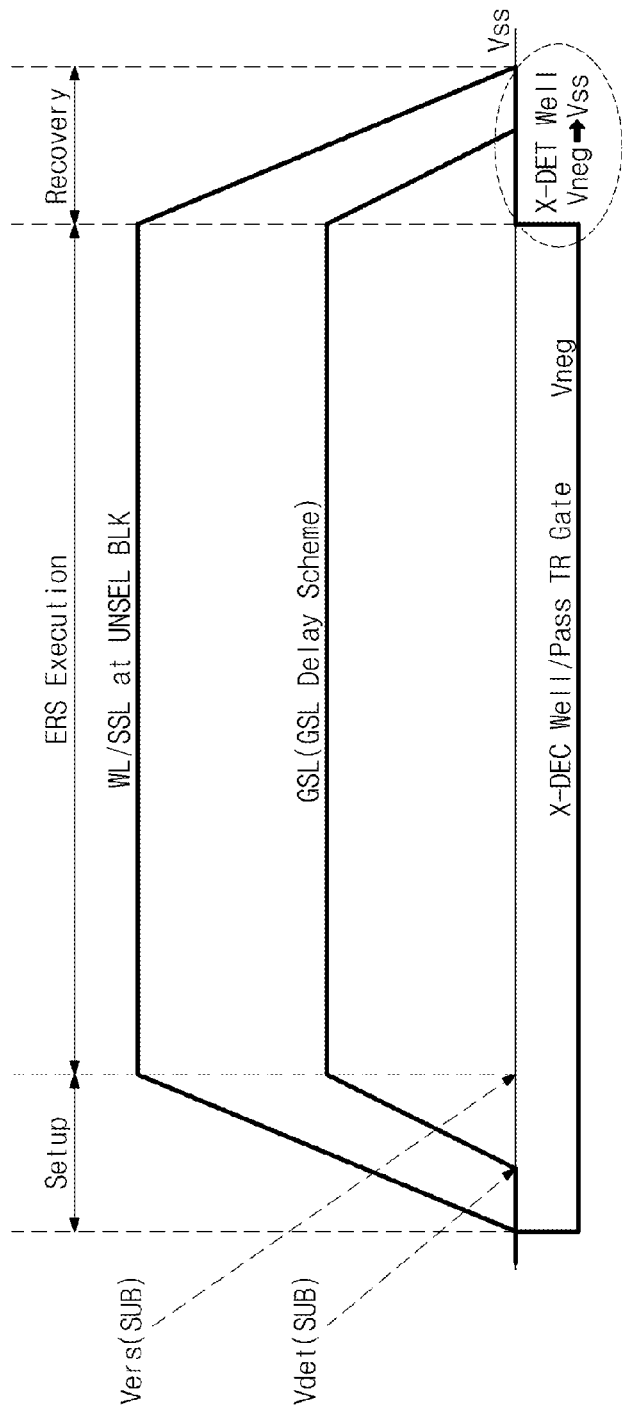
FIG. 8 is a diagram schematically illustrating a bias condition of an unselected memory block at an erase operation, according to a second embodiment of the inventive concept.

FIG. 8 is a diagram schematically illustrating a bias condition of an unselected memory block during an erase operation, according to a second embodiment of the inventive concept. In FIG. 8, bias conditions are the same as those described with reference to FIG. 7 except for the recovery period. During the recovery period of the erase operation, breakdown of the pass transistor may occur due to the negative voltage Vneg applied to the well of the address decoder. According to the present embodiment, a ground voltage Vss may be used in the recovery period to reduce unintended breakdown. That is, a return time point of the negative voltage Vneg is faster than that of a word line/bit line. Thus, as illustrated in FIG. 8, during the recovery period, the well of the address decoder is supplied with the ground voltage Vss, not the negative voltage Vneg. During the erase operation, breakdown of the pass transistor is reduced by providing the ground voltage Vss to the well of the address decoder.

Figure 9:
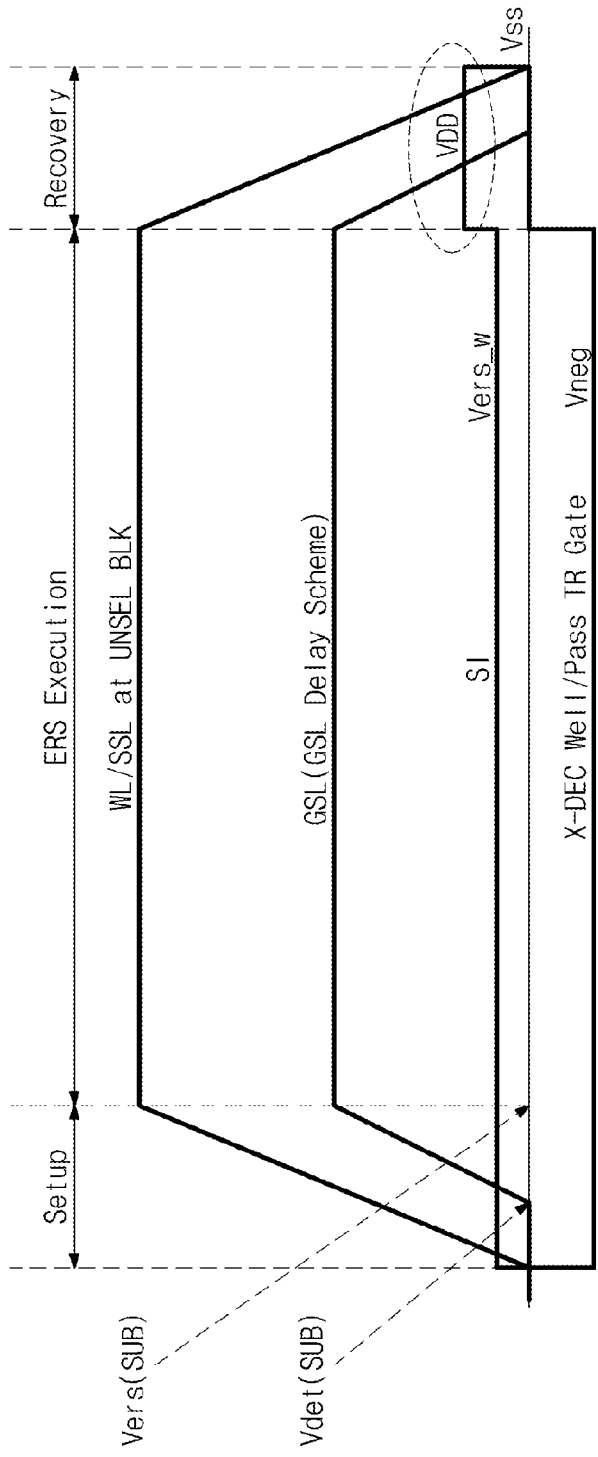
FIG. 9 is a diagram schematically illustrating a bias condition of an unselected memory block at an erase operation, according to a third embodiment of the inventive concept.

FIG. 9 is a diagram schematically illustrating a bias condition of an unselected memory block during an erase operation, according to a third embodiment of the inventive concept. In FIG. 9, bias conditions are the same as those described with reference to FIG. 8 except for the recovery period. As illustrated in FIG. 9, during the recovery period of the erase operation, a power supply voltage VDD is applied to a source line Sl to reduce unintended leakage. That is, as the source-drain voltage of a pass transistor PTunsel is further increased, leakage current is decreased (as described with reference to FIG. 6).

FIG. 10 is a diagram schematically illustrating a bias condition of an unselected memory block during an erase operation, according to a fourth embodiment of the inventive concept. In FIG. 10, bias conditions are the same as those described with reference to FIG. 9 except for a bias condition of a source line Sl during the setup period. As illustrated in FIG. 10, during the setup period, a power supply voltage VDD is applied to the source line Sl. As a source-drain voltage of a pass transistor PTunsel is further increased, leakage current is decreased (as described with reference to FIG. 6). That is, the gate voltage of the pass transistor PTunsel may increase by coupling based on an increasing slope of the erase voltage Vers during the setup period. By supplying the power supply voltage VDD to the source line Sl during the setup period, leakage due to the increase in the gate voltage of the pass transistor PTunsel is reduced. Afterwards, during the erase execution and recovery periods, a word line erase voltage Vers_w voltage is applied to the source line Sl.

FIG. 11 is a diagram schematically illustrating a bias condition of an unselected memory block during an erase operation, according to a fifth embodiment of the inventive concept. In FIG. 11, bias conditions are the same as those described with reference to FIG. 8 except for a bias condition of a source line Sl. As illustrated in FIG. 11, during a predetermined delay time period DT of the setup period, a word line erase voltage Vers_w is initially applied to a source line Sl corresponding to a ground selection line GSL. This reduces leakage of an unselected memory block in the GSL delay scheme. Afterwards, during a remainder of the setup period, and during the erase execution and recovery periods, a power supply voltage VDD is applied to the source line Sl. In other words, a first ground pass transistor connects a first ground selection line connected to a ground selection transistor of the selected memory block to a first ground source line and having a gate connected to receive the power supply voltage and a body connected to receive the negative voltage, a second ground pass transistor connects a second ground selection line connected to a ground selection transistor the unselected memory block to a second ground source line and having a gate and a body connected to receive the negative voltage, where during the erase operation, an erase word line voltage is first applied to the first and second ground source lines during the predetermined delay time period DT, and the power supply voltage is next applied to the first and second ground source lines after the predetermined delay time period DT for the remainder of the setup period.

Bias conditions during an erase operation using the GSL delay scheme are described with reference to FIGS. 7 to 11. However, embodiments of the inventive concept are not limited to an erase operation using the GSL delay scheme.

For example, FIG. 12 is a diagram schematically illustrating a bias condition of an unselected memory block during an erase operation, according to a sixth embodiment of the inventive concept, which does not use the GSL delay scheme. In FIG. 12, bias conditions are the same as those described with reference to FIG. 8 except for a bias condition of a ground selection line GSL. When a voltage of a substrate SUB becomes an erase voltage Vers like other word lines and a string selection line, the ground selection line GSL is also floated.

With the erase operations of the present embodiment, a negative voltage Vneg is applied to the well of the address decoder and to the gate and the body of the pass transistor of the unselected memory block during setup and erase execution periods. The voltage of the well of the address decoder (and to the gate and the body of the pass transistor) is then raised to a ground voltage Vss during the recovery period.

Figure 13:
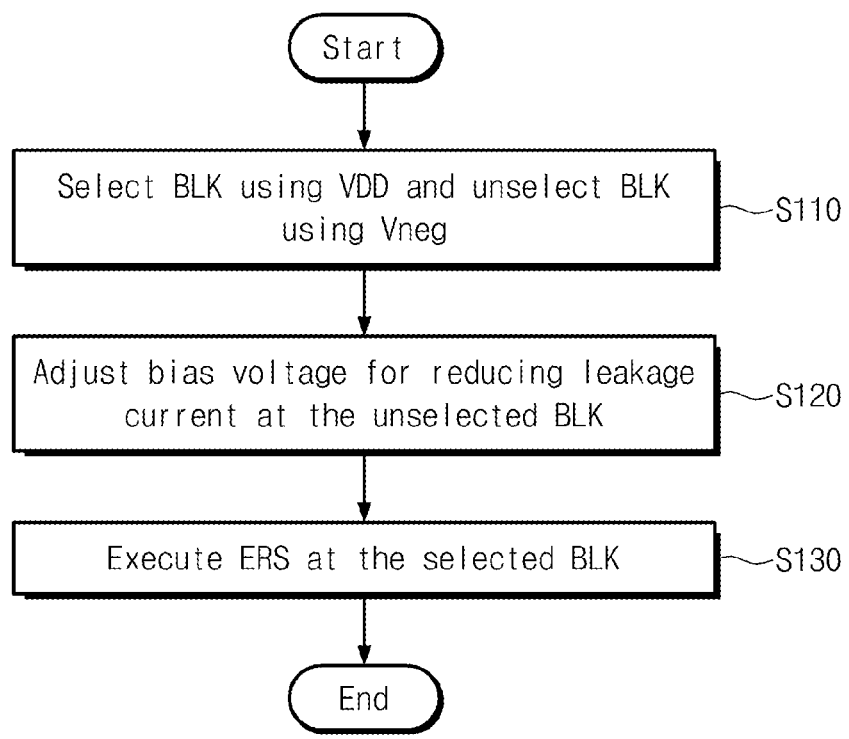
FIG. 13 is a flow chart schematically illustrating an erase operation of a nonvolatile memory device, according to an embodiment of the inventive concept.

FIG. 13 is a flow chart schematically illustrating an erase operation of a nonvolatile memory device according to an embodiment of the inventive concept. The erase operation is described with reference to FIGS. 1 to 14.

The nonvolatile memory device includes multiple memory blocks. In step S110, a memory block to be erased is selected using a power supply voltage VDD applied to a corresponding pass transistor, and the remaining memory block(s) of the multiple memory blocks to be erase-inhibited are unselected using a negative voltage Vneg applied to corresponding pass transistor(s). The memory block to be erased may be selected based on an input address, for example. In step S120, bias voltages associated with the pass transistors are adjusted to reduce leakage current of the unselected memory block(s). In step S 130, the selected memory block is erased.

The erase operation according to embodiments of the inventive concept enables significant reduction of leakage current of the unselected memory block(s) by adjusting the bias conditions of the corresponding pass transistor(s).

Figure 14:
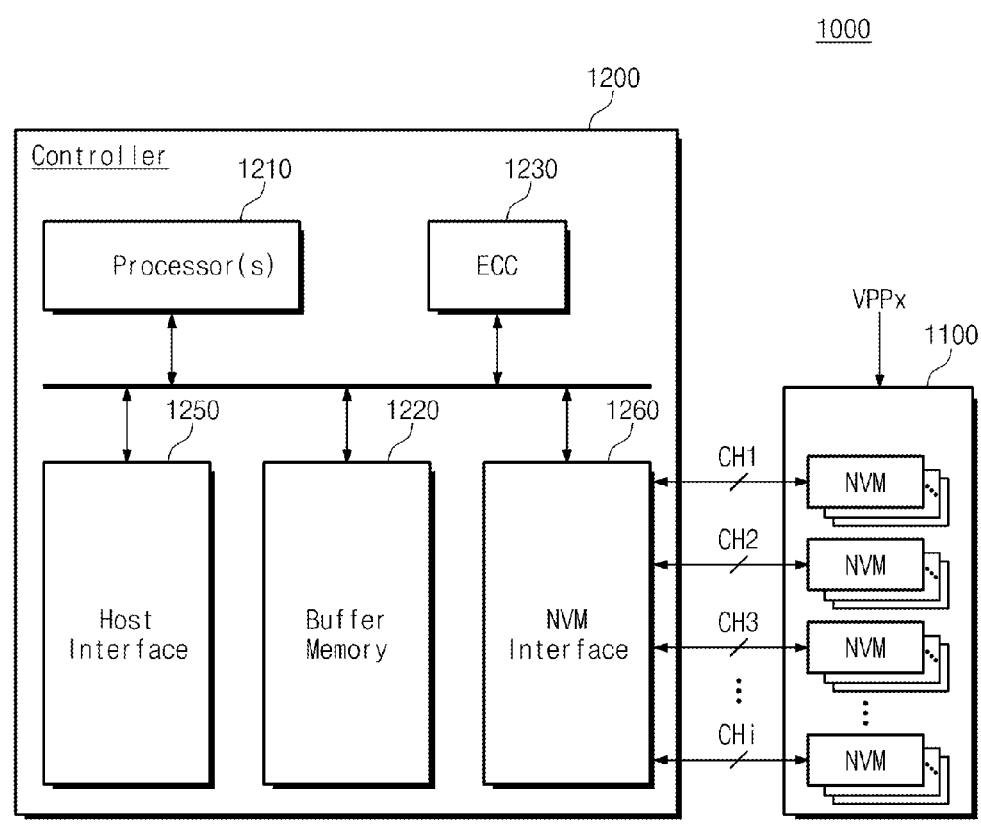
FIG. 14 is a block diagram schematically illustrating a solid state drive, according to an embodiment of the inventive concept.

Embodiments of the inventive concept are applicable to solid state drives (SSDs), for example. FIG. 14 is a block diagram schematically illustrating a solid state drive according to an embodiment of the inventive concept. Referring to FIG. 14, an SSD 1000 includes multiple nonvolatile memory devices 1100 and an SSD controller 1200.

The nonvolatile memory devices 1100 are configured to be provided with an external high voltage VPPx optionally. Each of the nonvolatile memory devices 1100 is configured to reduce leakage of an unselected memory block during an erase operation, as described with reference to FIGS. 1 to 13. The SSD controller 1200 is connected to the nonvolatile memory devices 1100 through channels CH1 to CHi (i being an integer of 2 or more). The SSD controller 1200 includes one or more processors 1210, a buffer memory 1220, an ECC block 1230, a host interface 1250, and a nonvolatile memory interface 1260.

The buffer memory 1220 stores data needed to drive the SSD controller 1200. In exemplary embodiments, the buffer memory 1220 may include multiple memory lines, each storing data or a command. Here, the memory lines may be mapped onto cache lines according to various methods.

The ECC block 1230 calculates error correction code values of data to be programmed during a writing operation and corrects errors of read data using the error correction code values during a read operation. During a data recovery operation, the ECC block 1230 may correct errors of data recovered from the nonvolatile memory devices 1100. Although not shown in FIG. 14, a code memory may be further included to store code data needed to drive the SSD controller 1200. The code memory may be implemented with a nonvolatile memory device.

The host interface 1250 provides an interface with an external device. The nonvolatile memory interface 1260 provides an interface with the nonvolatile memory devices 1100.

The SSD 1000 according to embodiments of the inventive concept has reduced leakage current of unselected memory blocks during erase operations. Hence, reliability of data stored in the unselected memory blocks is improved.

Figure 15:
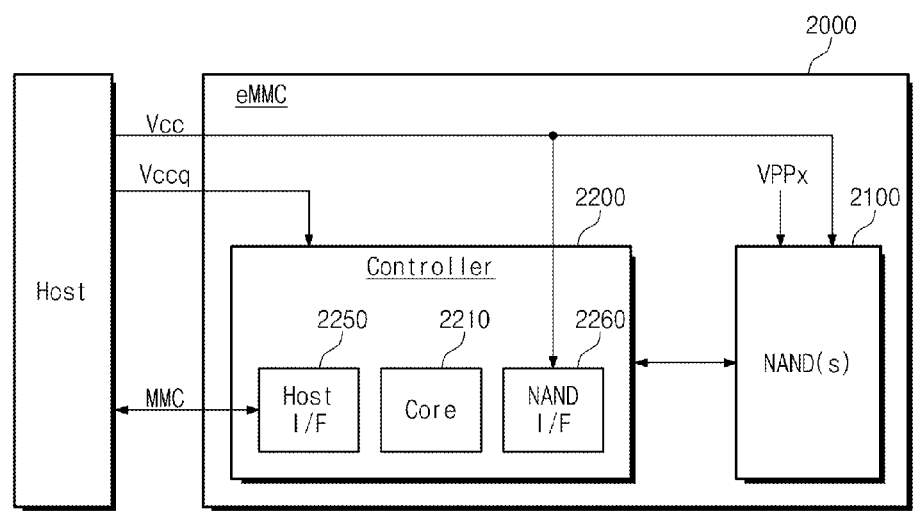
FIG. 15 is a block diagram schematically illustrating an eMMC according to an embodiment of the inventive concept.

Embodiments of the inventive concept are also applicable to embedded multimedia cards (eMMCs), including moviNAND and iNAND, for example. FIG. 15 is a block diagram schematically illustrating an eMMC according to an embodiment of the inventive concept. Referring to FIG. 15, an eMMC 2000 includes one or more NAND flash memory devices 2100 and a controller 2200.

The NAND flash memory devices 2100 may be a single data rate (SDR) NAND flash memory device or a double data rate (DDR) NAND flash memory device, or the NAND flash memory device 2100 may be a vertical NAND flash memory device. The NAND flash memory device 2100 reduces leakage current of unselected memory blocks during erase operations according to embodiments of the inventive concept. The controller 2200 may be connected to the NAND flash memory device 2100 via multiple channels. The controller 2200 includes one or more controller cores 2210, a host interface 2250, and a NAND interface 2260. The controller core 2210 may control overall operations of the eMMC 2000. The host interface 2250 is configured to interface between the controller 2210 and a Host. The NAND interface 2260 is configured to interface between the NAND flash memory device 2100 and the controller 2200.

In exemplary embodiments, the host interface 2250 may be a parallel interface (e.g., an MMC interface). In other exemplary embodiments, the host interface 2250 of the eMMC 2000 may be a serial interface (e.g., UHS-II, UFS, and the like).

The eMMC 2000 receives power supply voltages Vcc and Vccq from the Host. For example, the power supply voltage Vcc (e.g., about 3.3 V) may be supplied to the NAND flash memory device 2100 and the NAND interface 2260, and the power supply voltage Vccq (e.g., about 1.8 V/3.3 V) may be supplied to the controller 2200. In exemplary embodiments, the eMMC 2000 may be optionally supplied with an external high voltage.

The eMMC 2000 according to embodiments of the inventive concept adjusts a bias condition of a pass transistor of unselected memory blocks to reduce leakage current during an erase operation of a selected memory block. Hence, reliability of data stored in the unselected memory blocks is improved.

Figure 16:
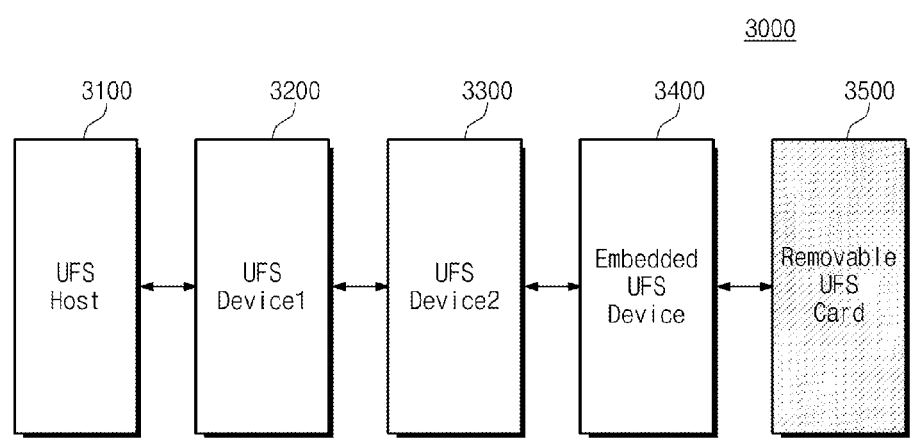
FIG. 16 is a block diagram schematically illustrating a UFS system, according to an embodiment of the inventive concept.

Embodiments of the inventive concept are also applicable to universal flash storage UFS. FIG. 16 is a block diagram schematically illustrating a UFS system according to an embodiment of the inventive concept. Referring to FIG. 16, a UFS system 3000 includes a UFS host 3100, first and second UFS devices 3200 and 3300, an embedded UFS device 3400, and a removable UFS card 3500. The UFS host 3100 may be an application processor of a mobile device, for example. Each of the UFS host 3100, the first and second UFS devices 3200 and 3300, the embedded UFS device 3400, and the removable UFS card 3500 may communicate with external devices through the UFS protocol. At least one of the first and second UFS devices 3200 and 3300, the embedded UFS device 3400, and the removable UFS card 3500 may be implemented with a nonvolatile memory device shown in FIG. 1.

Meanwhile, the embedded UFS device 3400 and the removable UFS card 3500 may perform communications using protocols different from the UFS protocol. The UFS host 3100 and the removable UFS card 3500 may communicate through various card protocols (e.g., UFDs, MMC, SD (secure digital), mini SD, Micro SD, and the like).

Figure 17:
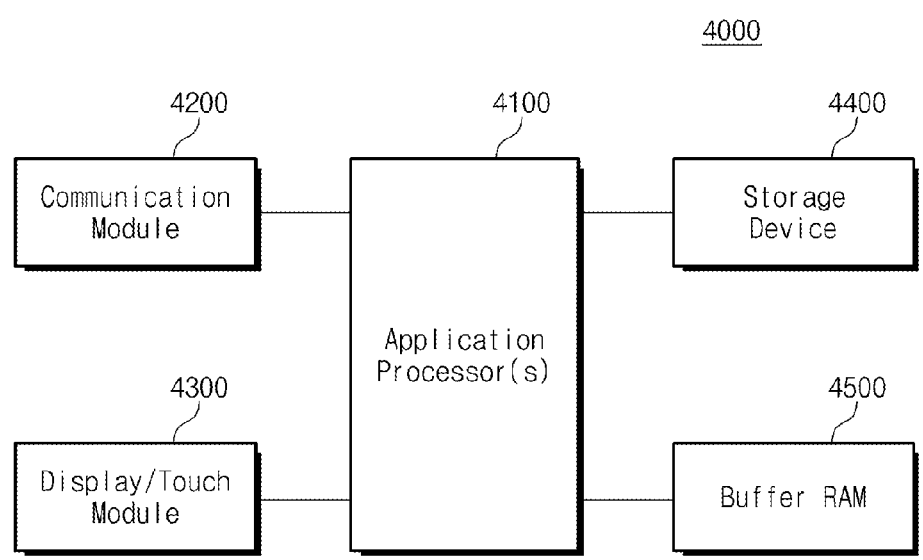
FIG. 17 is a block diagram schematically illustrating a mobile device, according to an embodiment of the inventive concept.

Embodiments of the inventive concept are also applicable to mobile devices, for example. FIG. 17 is a block diagram schematically illustrating a mobile device 4000 according to an embodiment of the inventive concept. Referring to FIG. 17, the mobile device 4000 includes an application processor 4100, a communication module 4200, a display/touch module 4300, a storage device 4400, and a buffer RAM 4500.

The application processor 4100 controls overall operations of the mobile device 4000. The communication module 4200 is configured to perform wireless and/or wired communications with an external device. The display/touch module 4300 is configured to display data processed by the application processor 4100 and/or to receive data through a touch panel. The storage device 4400 is configured to store user data. The storage device 4400 may be a storage device show in in FIG. 2 or FIG. 17, for example. The storage device 4400 is configured to include a nonvolatile memory device that adjusts a bias condition to reduce leakage current generated by a pass transistor of an unselected memory block during an erase operation, as described with reference to FIGS. 1 to 13. The buffer RAM 4500 is configured to temporarily store data needed for a processing operation of the mobile device 4000.

The mobile device 4000 according to embodiments of the inventive concept includes the storage device 4400 capable of adjusting bias conditions of unselected memory blocks to reduce leakage current during an erase operation of a selected memory block. Hence, reliability of data stored in the unselected memory blocks is improved.

A nonvolatile memory device and/or a memory controller according to embodiments of the inventive concept may be packaged according to any of a variety of different packaging technologies. Examples of such packaging technologies may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method of erasing a nonvolatile memory device comprising a plurality of memory blocks formed in a direction perpendicular to a substrate, each memory block having a plurality of strings connected to a bit line, and an address decoder configured to select a memory block of the plurality of memory blocks, the method comprising:
   selecting a memory block of the plurality memory blocks to be erased using a power supply voltage for turning on a first ground pass transistor corresponding to the selected memory block;
   unselecting a remaining memory block of the plurality of memory blocks, other than the selected memory block, using a negative voltage for turning off a second ground pass transistor corresponding to the unselected memory block;
   setting a bias condition to reduce leakage currents of the unselected memory block; and
   performing an erase operation on the selected memory block,
   wherein the address decoder comprises:
     the first ground pass transistor connecting a first ground selection line connected to a ground selection transistor of the selected memory block to a first ground source line and having a gate connected to receive the power supply voltage and a body connected to receive the negative voltage; and
     the second ground pass transistors corresponding to the unselected memory blocks, each second ground pass transistor connecting a second ground selection line connected to a ground selection transistor of each of the unselected memory blocks to a second ground source line and having a gate and a body connected to receive the negative voltage.

2. The method of claim 1, wherein the erase operation comprises a setup period, an erase execution period, and a recovery period.

3. The method of claim 2, further comprising:
   applying the negative voltage to a well of the address decoder for selecting the memory block and unselecting the remaining memory block during the erase operation.

4. The method of claim 3, further comprising:
   applying a ground voltage to the well of the address decoder during the recovery period.

5. The method of claim 3, further comprising:
   applying a word line erase voltage to source lines connected to corresponding word lines of the unselected memory block during the setup and erase execution periods; and
   applying a power supply voltage to the source lines connected to the corresponding word lines of the unselected memory block during the recovery period.

6. The method of claim 3, further comprising:
   applying a power supply voltage to source lines connected to corresponding word lines of the unselected memory block during the setup period;
   applying a word line erase voltage to the source lines connected to the corresponding word lines of the unselected memory block during the erase execution period; and
   applying the power supply voltage to the source lines connected to the corresponding word lines of the unselected memory block during the recovery period.

7. The method of claim 3, further comprising:
   applying a word line erase voltage to a ground selection line connected to the unselected memory block during a predetermined delay time period of the setup period; and
   applying a power supply voltage to the ground selection line connected to the unselected memory block after the predetermined delay time of the setup period elapses.

8. The method of claim 3, further comprising:
   floating word lines, a string selection line and a ground selection line connected to the unselected memory block when a voltage of the substrate becomes an erase voltage.

9. The method of claim 1, further comprising:
   applying a word line erase voltage to word lines connected to the selected memory block; and
   floating a string selection line connected to the selected memory block.

10. The method of claim 9, wherein the word line erase voltage is higher than a ground voltage and lower than a power supply voltage.

11. A nonvolatile memory device, comprising:
   a plurality of memory blocks formed in a direction perpendicular to a substrate, each memory block including a plurality of strings connected to a bit line, and each string having at least one string selection transistor, a plurality of memory cells and at least one ground selection transistor;
   an address decoder configured to select a memory block of the plurality of memory blocks to be erased in response to an address during an erase operation, remaining memory blocks other than the selected memory block being unselected; and
   control logic configured to control the address decoder such that, during the erase operation, the selected memory block is selected using a power supply voltage and a negative voltage and the remaining memory blocks are unselected using the negative voltage,
   wherein the address decoder comprises:
     a first ground pass transistor connecting a first ground selection line connected to a ground selection transistor of the selected memory block to a first ground source line and having a gate connected to receive the power supply voltage and a body connected to receive the negative voltage; and second ground pass transistors corresponding to the unselected memory blocks, each second ground pass transistor connecting a second ground selection line connected to a ground selection transistor of each of the unselected memory blocks to a second ground source line and having a gate and a body connected to receive the negative voltage.

12. The nonvolatile memory device of claim 11, wherein the address decoder comprises:

a first pass transistor connecting a first word line connected to a memory cell of the selected memory block to a first source line and having a gate connected to receive the power supply voltage and a body connected to receive the negative voltage; and second pass transistors corresponding to the unselected memory blocks, each second pass transistor connecting a second word line connected to a memory cell of each of the unselected memory blocks to a second source line and having a gate connected to receive the negative voltage and a body connected to receive the negative voltage.

13. The nonvolatile memory device of claim 11, wherein during an erase operation, an erase word line voltage is first applied to the first and second ground source lines during a predetermined delay time period, and the power supply voltage is next applied to the first and second ground source lines.

14. The nonvolatile memory device of claim 11, wherein during the erase operation, the negative voltage is applied to a well of the address decoder and to a gate and a body of at least one pass transistor included in the address decoder.

15. The nonvolatile memory device of claim 11, wherein the erase operation comprises a setup period, an erase execution period and a recovery period, and wherein the power supply voltage is applied to source lines connected to the unselected memory blocks during the setup and recovery periods.

16. The nonvolatile memory device of claim 11, wherein a ground selection line (GSL) delay scheme is used during the erase operation.

17. A nonvolatile memory device, comprising:

a memory cell array comprising a plurality of memory blocks, each memory block comprising a plurality of strings connected to a bit line, and each string having at least one string selection transistor, a plurality of memory cells and at least one ground selection transistor;

an address decoder for selecting a memory block of the plurality of memory blocks to be erased during an erase operation, and for unselecting a memory block of the plurality of memory blocks other than the selected memory block to be erase-inhibited during the erase operation; and control logic configured to control the address decoder to provide a power supply voltage and a negative voltage to the selected memory block and to provide the negative voltage to the unselected memory block to reduce leakage current from the unselected memory block during the erase operation, wherein the address decoder comprises:

a first ground pass transistor connecting a first ground selection line connected to a ground selection transistor of the selected memory block to a first ground source line and having a gate connected to receive the power supply voltage and a body connected to receive the negative voltage; and second ground pass transistors corresponding to the unselected memory blocks, each second ground pass transistor connecting a second ground selection line connected to a ground selection transistor of each of the unselected memory blocks to a second ground source line and having a gate and a body connected to receive the negative voltage.

18. The nonvolatile memory device of claim 17, wherein the address decoder comprises:

a first pass transistor comprising a gate for receiving the power supply voltage and a body for receiving the negative voltage in order to connect a first source line and a first word line connected to a first memory cell of the selected memory block during the erase operation; and a second pass transistor comprising a gate for receiving the negative voltage and a body for receiving the negative voltage in order to connect a second source line and a second word line connected to a second memory cell of the unselected memory block during the erase operation.

19. The nonvolatile memory device of claim 18, wherein an erase voltage is applied to a source of each of the first and second memory cells, and a word line erase voltage is applied to a gate of the first memory cell, during the erase operation.

20. The nonvolatile memory device of claim 19, wherein a word line erase voltage of the second source line is set to be higher than 0V, which together with the negative voltage applied to the gate of the second pass transistor, decreases a gate-source voltage of the second pass transistor.

* * * * *